United States Patent
Konno et al.

(10) Patent No.: US 11,522,105 B2
(45) Date of Patent: Dec. 6, 2022

(54) NITRIDE SEMICONDUCTOR LAMINATED STRUCTURE, NITRIDE SEMICONDUCTOR LIGHT EMITTING ELEMENT, AND METHOD FOR MANUFACTURING NITRIDE SEMICONDUCTOR LAMINATED STRUCTURE

(71) Applicant: SUMITOMO CHEMICAL COMPANY, LIMITED, Tokyo (JP)

(72) Inventors: Taichiro Konno, Hitachi (JP); Takeshi Kimura, Hitachi (JP); Hajime Fujikura, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 17/025,687

(22) Filed: Sep. 18, 2020

(65) Prior Publication Data
US 2021/0151625 A1 May 20, 2021

(30) Foreign Application Priority Data

Sep. 24, 2019 (JP) .............................. JP2019-172550
Jan. 22, 2020 (JP) .............................. JP2020-008385

(51) Int. Cl.
| H01L 33/32 | (2010.01) |
| H01L 33/20 | (2010.01) |
| H01L 33/00 | (2010.01) |

(52) U.S. Cl.
CPC .......... *H01L 33/32* (2013.01); *H01L 33/0075* (2013.01); *H01L 33/20* (2013.01)

(58) Field of Classification Search
CPC ..... H01L 33/20; H01L 33/32; H01L 33/0075; H01L 33/007
See application file for complete search history.

(56) References Cited

U.S. PATENT DOCUMENTS

| 2003/0170503 | A1 | 9/2003 | Shibata et al. | |
| 2016/0268130 | A1* | 9/2016 | Sugiyama | H01L 21/02505 |
| 2016/0268477 | A1* | 9/2016 | Fujita | H01L 33/32 |
| 2018/0158680 | A1* | 6/2018 | Fujikura | H01L 21/02502 |

FOREIGN PATENT DOCUMENTS

JP 2004-142953 A 5/2004

* cited by examiner

*Primary Examiner* — Savitri Mulpuri
(74) *Attorney, Agent, or Firm* — Foley & Lardner LLP (57) ABSTRACT

An object of the present disclosure is to provide a technique capable of attaining an AlN template which has less strain and is suitable for producing the ultraviolet LED. Provided is a nitride semiconductor laminate structure, including at least a sapphire substrate, a first AlN layer formed on a principal surface of the sapphire substrate, and a second AlN layer formed on the first AlN layer, wherein an absolute value of a strain amount $\varepsilon_2$ of the second AlN layer in the a-axis direction is smaller than an absolute value of a strain amount $\varepsilon_1$ of the first AlN layer in the a-axis direction.

7 Claims, 6 Drawing Sheets

FIG. 7

NITRIDE SEMICONDUCTOR LAMINATED STRUCTURE, NITRIDE SEMICONDUCTOR LIGHT EMITTING ELEMENT, AND METHOD FOR MANUFACTURING NITRIDE SEMICONDUCTOR LAMINATED STRUCTURE

CROSS-REFERENCE TO RELATED APPLICATIONS

The present application claims priority to and the benefit of Japanese Patent Application Nos. 2019-172550, filed on Sep. 24, 2019, and 2020-008385, filed on Jan. 22, 2020. The contents of these applications are hereby incorporated by reference in their entireties.

TECHNICAL FIELD

The present disclosure relates to a nitride semiconductor laminate structure, a nitride semiconductor light-emitting element, and a method for producing a nitride semiconductor laminate structure.

DESCRIPTION OF RELATED ART

An ultraviolet LED is formed by laminating a nitride semiconductor layer containing a large amount of Al. As a base of the ultraviolet LED, for example, an AlN template is used which is obtained by epitaxially growing an AlN layer as a buffer layer on a sapphire substrate. For example, Patent Document 1 proposes an epitaxial substrate in which an Al-containing nitride film is formed on a sapphire substrate.
[Patent Document 1] Japanese Patent Laid-Open Publication No. 2004-142953

SUMMARY OF THE INVENTION

An object of the present disclosure is to provide a technique capable of attaining an AlN template which has less strain and is suitable for producing the ultraviolet LED.

Means for Solving the Problem

In an aspect of the present disclosure,
there is provided a nitride semiconductor laminate structure, including at least:
a sapphire substrate,
a first AlN layer formed on a principal surface of the sapphire substrate, and
a second AlN layer formed on the first AlN layer,
wherein an absolute value of a strain amount $\varepsilon_2$ of the second AlN layer in the a-axis direction is smaller than an absolute value of a strain amount $\varepsilon_1$ of the first AlN layer in the a-axis direction.

In another aspect of the present disclosure,
there is provided a nitride semiconductor laminate structure, including:
a sapphire substrate, and
an AlN layer formed on a principal surface of the sapphire substrate,
wherein a strain amount of AlN constituting a surface of the AlN layer in the a-axis direction is −0.15% or more and 0.1% or less.

In another aspect of the present disclosure,
there is provided a method for producing a nitride semiconductor laminate structure, including:
a step of preparing a sapphire substrate,
a step of forming a first AlN layer on a principal surface of the sapphire substrate,
a step of performing heat-treatment on the surface of the first AlN layer in an atmosphere containing hydrogen gas and substantially no ammonia, and
a step of forming a second AlN layer on the first AlN layer,
wherein an absolute value of a strain amount $\varepsilon_2$ of the second AlN layer in the a-axis direction is smaller than an absolute value of a strain amount $\varepsilon_1$ of the first AlN layer in the a-axis direction.

In another aspect of the present disclosure,
there is provided a method for producing a nitride semiconductor laminate structure, including:
a step of preparing a sapphire substrate,
a step of forming an AlN layer on a principal surface of the sapphire substrate,
a step of performing heat-treatment on a surface of the AlN layer in an atmosphere containing hydrogen gas and substantially no ammonia, and
a step of re-growing AlN on the AlN layer,
wherein, after the step of re-growing the AlN, a strain amount of AlN constituting the surface of the AlN layer in the a-axis direction is −0.15% or more and 0.1% or less.

Advantage of the Invention

According to the present disclosure, an AlN template which has less strain and is suitable for producing an ultraviolet LED can be attained.

DETAILED DESCRIPTION OF THE INVENTION

<Knowledges Obtained by the Inventors>

First, the findings obtained by the inventors will be described.

An ultraviolet LED is formed by laminating a nitride semiconductor layer containing a large amount of Al. As a base of the ultraviolet LED, for example, a single crystal AlN substrate or AlN template is used.

The single crystal AlN substrate is attained, for example, by growing the AlN to a thickness of about several millimeters to several centimeters on a dissimilar substrate by a sublimation method and removing the dissimilar substrate. As the single crystal AlN substrates, for example, those having a dislocation density of $1\times10^5$ cm$^{-2}$ or less can be obtained. However, there are some problems such as difficulty in attaining a substrate with a large diameter of 1 inch or more, and high absorption in the UV region due to contamination of impurities.

The AlN template is obtained, for example, by growing an AlN layer to a thickness of several hundreds of nanometers to several tens of micrometers as a buffer layer on the sapphire substrate. The AlN template has an AlN layer thinner than that of the single crystal AlN substrate, so that it is unlikely to crack and can be easily grown to a larger diameter. For example, since a vapor deposition method such as the HVPE method (Hydride Vapor Phase Epitaxy) is used, contamination of impurities can be suppressed.

However, a large compressive strain is often placed on the growth surface of the AlN template in the direction parallel to the surface. Accordingly, the a-axis length on the surface of the AlN layer is smaller than that of a strain-free, bulk AlN, for example, by about 0.2 to 0.6%. Therefore, for example, when AlGaN having a larger lattice constant than that of the AlN is laminated on the AlN template in order to attain the ultraviolet LED, the gap between the a-axis lengths of the AlN layer and the AlGaN layer becomes larger, and thus a larger strain is accumulated in the AlGaN layer. Such a large accumulation of strain produces, for example, rough surface during growth of the AlGaN layer and rapid lattice relaxation in the light-emitting layer portion, in the ultraviolet LED, which causes characteristic deterioration.

The present inventor has studied intensively on the above-described events. As a result, the present inventor has found that the AlN layer which is almost strain-free and has high crystallinity can be grown by heat-treating a strained AlN template under appropriate conditions, and thereafter re-growing the AlN.

DETAILS OF EMBODIMENT OF THE DISCLOSURE

Next, an embodiment of the present disclosure will be described below with reference to the drawings. The present disclosure is not limited to these illustrations but intended to be indicated by claims and to encompass all the changes which fall within the meaning and scope equivalent to claims.

First Embodiment of the Disclosure (1) Constitution of Nitride Semiconductor Laminate Structure 10

First, constitution of the nitride semiconductor laminate structure 10 of this embodiment will be illustrated.

Figure 1:
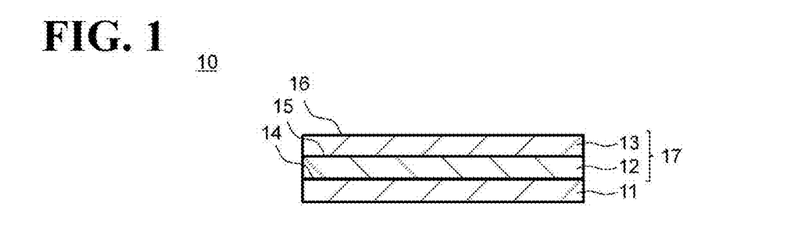
FIG. 1 is a schematic cross-sectional view of a nitride semiconductor laminate structure 10 according to a first embodiment of the present disclosure.

FIG. 1 is a schematic cross-sectional view of nitride semiconductor laminate structure 10 of this embodiment. As illustrated in FIG. 1, nitride semiconductor laminate structure 10 of this embodiment includes, for example, sapphire substrate 11, and AlN layer 17 formed directly on principal surface 14 of the sapphire substrate 11. The AlN layer 17 includes, for example, first AlN layer 12 and second AlN layer 13.

For example, the sapphire substrate 11 is constituted by single crystal sapphire and has the principal surface 14 serving as a base on which to grow the first AlN layer 12. In the principal surface 14, the c-plane is inclined by an off-angle of 1.5° or less (preferably, 0.05° or more and 1° or less). With the off-angle of the principal surface 14 being 1.5° or less, the flatness of the first AlN layer 12 grown on the sapphire substrate 11 can be improved. With the off-angle of the principal surface 14 being 0.05° or more and 1° or less, the crystallinity of the first AlN layer 12 and the second AlN layer 13 grown on the sapphire substrate 11 can be improved. The off-angle of the principal surface 14 may have an in-plane distribution in a range of 1.5° or less (or 0.05° or more and 1° or less). The inclination direction of the off-angle of the principal surface 14 may be in the a-axis direction or in the m-axis direction.

For example, a diameter of the sapphire substrate 11 is preferably 1 inch or more. When the diameter of the sapphire substrate 11 is 1 inch or more, an AlN template having a large diameter with reduced cracks can be attained. The thickness of the sapphire substrate 11 can be arbitrarily designed according to the application of the nitride semiconductor laminate structure 10.

The first AlN layer 12 is formed on the principal surface 14 of the sapphire substrate 11. The first AlN layer 12 is constituted by, for example, the AlN heteroepitaxially grown on the principal surface 14 of the sapphire substrate 11. For example, the thickness of the first AlN layer 12 is preferably 0.1 µm or more and 10 µm or less. When the thickness of the first AlN layer 12 is less than 0.1 µm, the crystallinity of the second AlN layer 13 grown on the first AlN layer 12 may be possibly reduced. In contrast, when the thickness of the first AlN layer 12 is 0.1 µm or more, the crystallinity of the second AlN layer 13 grown on the first AlN layer 12 can be improved. On the other hand, when the thickness of the first AlN layer 12 is more than 10 µm, cracks are likely to occur in the first AlN layer 12. In contrast, when the thickness of the first AlN layer 12 is 10 µm or less, the crack can be made less likely to occur. More preferably, the thickness of the first AlN layer 12 is 0.1 µm or more and 2 µm or less. As a result, the warpage of the nitride semiconductor laminate structure 10 can be reduced. The surface 15 of the first AlN layer 12 preferably has Al polarity.

The first AlN layer 12 has a compressive strain in a direction parallel to its surface 15 (for example, in the a-axis direction). The strain amount $\varepsilon_1$ of the first AlN layer 12 in the a-axis direction is, for example, −0.6% or more and −0.2% or less. In this specification, the strain amount in the a-axis direction represents, for example, the change in percentage of the a-axis length in the AlN crystal from the a-axis length in the strain-free, bulk AlN (lattice constant). A positive value for the strain amount means that the crystal has tensile strain, while a negative value for the strain amount means that the crystal has compressive strain. Specifically, for example, the strain amount $\varepsilon_1$ in the first AlN layer 12 is represented by the following equation (1):

$$\varepsilon_1 = (a_1 - a_0)/a_0 \quad (1)$$

wherein $a_1$ represents the a-axis length in the first AlN layer 12 and $a_0$ represents the a-axis length in the strain-free, bulk AlN.

The half width of the X-ray rocking curve of AlN (0002) of the first AlN layer 12 is, for example, 250 seconds or less. The half width of the X-ray rocking curve of AlN (10-12) of the first AlN layer 12 is, for example, 500 seconds or less. It can be said that the smaller the half width of the X-ray rocking curve is, the higher the crystallinity is. Therefore, for example, the half width of the X-ray rocking curve of AlN (0002) of the first AlN layer 12 is more preferably 200 seconds or less, and most preferably 150 seconds or less. For example, the half width of the X-ray rocking curve of AlN (10-12) of the first AlN layer 12 is more preferably 400 seconds or less, and most preferably 300 seconds or less. When the half width of the X-ray rocking curve of the first AlN layer 12 has a value described above, the crystallinity of the second AlN layer 13 grown on the first AlN layer 12 can be improved.

The second AlN layer 13 is formed on the surface 15 of the first AlN layer 12. The second AlN layer 13 is constituted by, for example, the AlN homoepitaxially grown on the surface 15 of the first AlN layer 12. For example, the thickness of the second AlN layer 13 is preferably 0.1 μm or more and 10 μm or less. When the thickness of the second AlN layer 13 is less than 0.1 μm, the crystallinity of the nitride semiconductor layer grown on the second AlN layer 13 in order to attain an ultraviolet LED may be possibly reduced. In contrast, when the thickness of the second AlN layer 13 is 0.1 μm or more, the crystallinity of the nitride semiconductor layer grown on the second AlN layer 13 can be improved. On the other hand, when the thickness of the second AlN layer 13 is more than 10 μm, cracks are likely to occur in the second AlN layer 13. In contrast, when the thickness of the second AlN layer 13 is 10 μm or less, the crack can be made less likely to occur. More preferably, the thickness of the second AlN layer 13 is 0.1 μm or more and 2 μm or less. As a result, the warpage of the nitride semiconductor laminate structure 10 can be reduced. The surface 16 of the second AlN layer 13 preferably has Al polarity.

For example, the thickness of the AlN layer 17 is preferably 0.2 μm or more and 20 μm or less. When the thickness of the AlN layer 17 is within the above-described range, the crack can be made less likely to occur.

Unlike the first AlN layer 12, the second AlN layer 13 has almost no compressive strain (and tensile strain) in a direction parallel to its surface 16 (for example, in the a-axis direction). Therefore, an absolute value of a strain amount $\varepsilon_2$ of the second AlN layer 13 in the a-axis direction is smaller than an absolute value of a strain amount $\varepsilon_1$ of the first AlN layer 12 in the a-axis direction. Thereby, the strain accumulated in the nitride semiconductor layer can be reduced, for example, when the nitride semiconductor layer is laminated on the second AlN layer 13 in order to attain the ultraviolet LED. The strain amount $\varepsilon_2$ in the second AlN layer 13 is represented by the following equation (2):

$$\varepsilon_2 = (a_2 - a_0)/a_0 \qquad (2)$$

wherein $a_2$ represents the a-axis length in the second AlN layer 13 and $a_0$ represents the a-axis length in the strain-free, bulk AlN.

The strain amount $\varepsilon_2$ of the AlN constituting the surface 16 of the AlN layer 17, that is, the second AlN layer 13, in the a-axis direction is, for example, −0.15% or more and 0.1% or less (preferably −0.1% or more and 0.1% or less). Thereby, the strain accumulated in the nitride semiconductor layer can be reduced, for example, when the nitride semiconductor layer is laminated on the second AlN layer 13 in order to attain the ultraviolet LED. As a result, the characteristics of the ultraviolet LED can be improved.

The half width of the X-ray rocking curve of AlN (0002) of the second AlN layer 13 is, for example, 250 seconds or less, more preferably 200 seconds or less, and most preferably 150 seconds or less. Preferably, the half width of the X-ray rocking curve of AlN (0002) of the second AlN layer 13 is smaller than the half width of the X-ray rocking curve of AlN (0002) of the first AlN layer 12. Furthermore, the half width of the X-ray rocking curve of AlN (10-12) of the second AlN layer 13 is 500 seconds or less, more preferably, 400 seconds or less, and most preferably 300 seconds or less. Preferably, the half width of the X-ray rocking curve of AlN (10-12) of the second AlN layer 13 is smaller than the half width of the X-ray rocking curve of AlN (10-12) of the first AlN layer 12. Namely, it can be said that the crystallinity of the second AlN layer 13 is equal to or higher than that of the first AlN layer 12. Thereby, the crystallinity of the nitride semiconductor layer grown on the second AlN layer 13 can be improved.

Since the nitride semiconductor laminate structure 10 of this embodiment has the above-described constitution, it can be suitably used as the AlN template which serves as a base of the ultraviolet LED. When the ultraviolet LED is produced using the nitride semiconductor laminate structure 10 of this embodiment, the strain of the second AlN layer 13 is small, so that the strain accumulated in the nitride semiconductor (for example, AlGaN) laminated on the nitride semiconductor laminate structure 10 can be reduced, and the characteristics of the ultraviolet LED can be improved.

(2) Method for Producing Nitride Semiconductor Laminate Structure 10

Next, a method for producing the nitride semiconductor laminate structure 10 of this embodiment will be illustrated.

Figure 2:
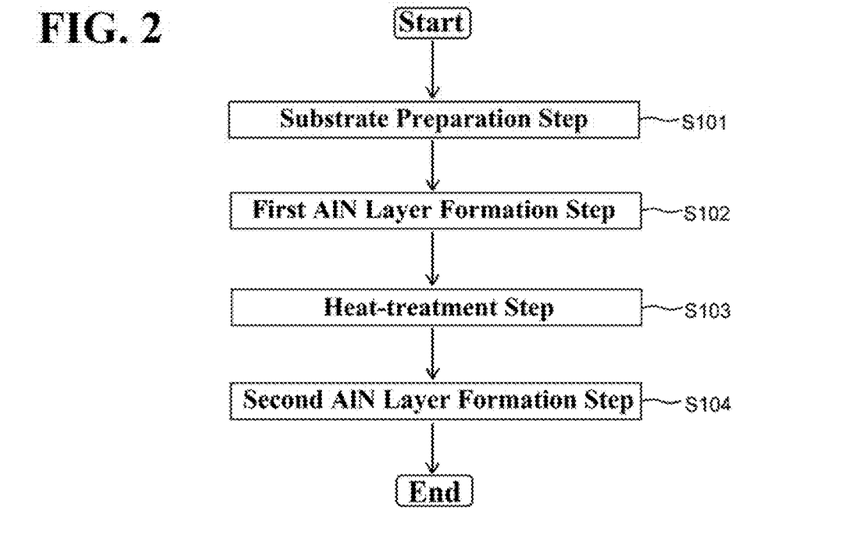
FIG. 2 is a flow chart illustrating an exemplary method for producing a nitride semiconductor laminate structure 10 according to a first embodiment of the present disclosure.

FIG. 2 is a flow chart illustrating an exemplary method for producing nitride semiconductor laminate structure 10 according to this embodiment. The method for producing the nitride semiconductor laminate structure 10 of this embodiment includes, for example, substrate preparation step S101, first AlN layer formation step S102, heat-treatment step S103, and second AlN layer formation step S104.

(Substrate Preparation Step S101)

In the substrate preparation step S101, sapphire substrate 11 having principal surface 14 is prepared in which c-plane is inclined by an off-angle of 1.5° or less (preferably 0.05° or more and 1° or less). As the sapphire substrate 11, those manufactured by an existing method can be used.

(First AlN Layer Formation Step S102)

In the first AlN layer formation step S102, the first AlN layer 12 as a part of the AlN layer 17 is formed on the principal surface 14 of the sapphire substrate 11. The first AlN layer 12 is formed by a vapor deposition method, preferably by HVPE method. As a raw material gas of Al, for example, AlCl gas or $AlCl_3$ gas is used. As a raw material gas of N, for example, $NH_3$ gas is used. These raw material gases may be mixed and supplied with a carrier gas including $H_2$ gas, $N_2$ gas, or a mixed gas thereof.

Examples of growth conditions for the first AlN layer 12 in the first AlN layer formation step S102 are listed below: The V/III ratio is a ratio of a supply amount of group V (N) raw material gas to a supply amount of group III (Al) raw material gas.

Growth temperature: 900 to 1,300° C.

V/III ratio: 0.2 to 200

Growth rate: 0.5 to 3,000 nm/min

For the purpose of preventing adhesion of AlN to nozzles of gas supply pipes used to introduce various gases to a growth chamber in an HVPE apparatus, HCl gas may be supplied. An exemplary supply amount of HCl gas is such that the ratio of HCl gas to AlCl gas or AlCl$_3$ gas is 0.1 to 100.

In the first AlN layer formation step S102, high-quality first AlN layer 12 can be formed by several ways. Examples of a method for forming the high-quality first AlN layer 12 include control of crystal growth conditions and annealing treatment. The former can form the high-quality first AlN layer 12, for example, by appropriately controlling the growth temperature and V/III ratio. The latter can improve the crystallinity of the first AlN layer 12, for example, by growing the first AlN layer 12 and thereafter annealing it in an atmosphere containing N$_2$ gas. The annealing treatment is preferably performed at a temperature of 1,400° C. or more and 1,700° C. or less, for example.

In the first AlN layer formation step S102, crystallinity of the first AlN layer 12 can be improved, for example, by the above-described method. In this step, the first AlN layer 12 is formed so that the half width of the X-ray rocking curve of AlN (0002) of the first AlN layer 12 is, for example, 250 seconds or less (more preferably 200 seconds or less, and most preferably 150 seconds or less), and the half width of the X-ray rocking curve of AlN (10-12) is, for example, 500 seconds or less (more preferably 400 seconds or less, and most preferably 300 seconds or less). Thereby, the crystallinity of the second AlN layer 13 grown on the first AlN layer 12 can be improved.

However, in any of the above-described methods, compressive strain due to the difference in lattice constant from the sapphire substrate 11 tends to be introduced into the first AlN layer 12 in the direction parallel to its surface 15 (for example, in the a-axis direction) upon quality improvement of the first AlN layer 12. In the first AlN layer formation step S102, the first AlN layer 12 is formed such that the strain amount $\varepsilon_1$ of the first AlN layer 12 in the a-axis direction is typically -0.6% or more and -0.2% or less.

(Heat-Treatment Step S103)

In the heat-treatment step S103, heat-treatment is performed on the surface 15 of the first AlN layer 12 under predetermined conditions. In the heat-treatment step S103, the heat-treatment may be performed in the growth chamber of the HVPE apparatus, or the heat-treatment may be performed in another apparatus. The heat-treatment step S103 can be performed to modify the surface 15 of the first AlN layer 12 and relax the strain accumulated in the second AlN layer 13 which will be subsequently formed on the surface 15.

The heat-treatment step S103 is performed in an atmosphere containing hydrogen gas (H$_2$ gas). H$_2$ gas may be mixed and supplied with an inert gas such as N$_2$ gas, or Ar gas. The heat-treatment can be performed in an atmosphere containing hydrogen to relax the compressive strain accumulated in the surface 15 of the first AlN layer 12. Although the mechanism of compressive strain relaxation is not clear at present, a mechanism is envisaged in which the presence of the hydrogen gas in the atmosphere in the heat-treatment step S103 promotes the generation of the point defects in the AlN crystals. It is supposed that nitrogen atoms in the AlN combine with hydrogen on the surface to become ammonia which is eliminated, so that a large number of nitrogen vacancies are formed in the AlN, which act as voids of atomic size and thus relax the strain in the second AlN layer 13 on which the first AlN layer 12 is grown.

The heat-treatment step S103 begins in an atmosphere containing substantially no ammonia. Specifically, the step is performed without supplying NH$_3$ gas, for example. When the heat-treatment is performed in an atmosphere containing ammonia, the formation of point defects (nitrogen vacancies) described above is suppressed. As a result, it is difficult to relax the strain in the second AlN layer 13. In addition, when heat-treatment is performed in the growth chamber of the HVPE apparatus, NH$_3$ gas introduced in the first AlN layer formation step S102 may possibly remain in the growth chamber. Therefore, it is preferable to discharge (or replace) all of the gases in the growth chamber before performing the heat-treatment. As used herein, the expression "containing substantially no ammonia" means, for example, that the partial pressure of NH$_3$ gas in the growth chamber is less than 1% of the total pressure. As described above, in the heat-treatment step S103, nitrogen atom in the AlN is supposed to combine with hydrogen on the surface, which is eliminated as ammonia. However, ammonia generated by elimination is in very small amount. Therefore, such ammonia never makes the partial pressure of NH$_3$ gas in the growth chamber 1% or more of the total pressure.

The heat-treatment step S103 is preferably performed at a temperature (hereinafter referred to as heat-treatment temperature) of 900° C. or more and 1,300° C. or less, for example. When the heat-treatment temperature is less than 900° C., the surface 15 is less likely to be modified. In contrast, when the heat-treatment temperature is raised to 900° C. or more, the surface 15 can be easily modified. On the other hand, when the heat-treatment temperature exceeds 1,300° C., the surface 15 may be possibly decomposed. In contrast, when the heat-treatment temperature is reduced to 1,300° C. or less, decomposition of the surface 15 can be suppressed.

The heat-treatment step S103 is preferably performed for a time period (hereinafter referred to as heat-treatment time) of 10 minutes or more and 120 minutes or less, for example. When the heat-treatment time is less than 10 minutes, the surface 15 is less likely to be modified. In contrast, when the heat-treatment time is 10 minutes or more, the surface 15 can be easily modified. On the other hand, when the heat-treatment time exceeds 120 minutes, flatness of the surface 15 may be possibly reduced. In contrast, when the heat-treatment time is decreased to 120 minutes or less, reduction in flatness of the surface 15 can be suppressed.

The more preferable heat-treatment time is 30 minutes or more and 90 minutes or less. The most preferable heat-treatment time is 60 minutes in consideration of stably obtaining good characteristics and of the cost required for the heat-treatment. When the heat-treatment time is appropriately controlled, an appropriate amount of point defects is introduced while the surface condition of the surface 15 is kept flat. Therefore, the crystallinity of the second AlN layer 13 formed on the surface 15 can be improved compared to that of the first AlN layer 12. In addition, the strain of the second AlN layer 13 can be further relaxed to form the second AlN layer 13 that is almost strain-free.

(Second AlN Layer Formation Step S104)

In the second AlN layer formation step S104, the second AlN layer 13 as a part of the AlN layer 17 is formed on the surface 15 of the first AlN layer 12. The second AlN layer formation step S104 can be rephrased as a step of re-growing AlN on the surface 15 of the first AlN layer 12. The formation of the second AlN layer 13 may be performed under the same conditions as in the first AlN layer formation step S102. The more preferable growth conditions of the second AlN layer 13 are as follows.

Growth temperature: 900 to 1,100° C.
V/III ratio: 0.2 to 200
Growth rate: 100 to 3,000 nm/min
Ratio of HCl/AlCl (or $AlCl_3$): 1 to 100

Since the surface 15 of the first AlN layer 12 is modified in the heat-treatment step S103, the second AlN layer 13 is less likely to experience compressive strain (and tensile strain) in a direction parallel to its surface 16 (for example, in the a-axis direction). In the second AlN layer formation step S104, the second AlN layer 13 is formed such that the strain amount $\varepsilon_2$ of the second AlN layer 13 in the a-axis direction is, for example, −0.15% or more and 0.1% or less.

Since the heat-treatment is performed under appropriate conditions in the heat-treatment step S103, the surface 15 of the first AlN layer 12 is modified, and an appropriate amount of point defects is introduced while good surface condition is maintained. In the second AlN layer formation step S104, therefore, a higher-quality second AlN layer 13 can be formed. In this step, the second AlN layer 13 is formed so that the half width of the X-ray rocking curve of AlN (0002) of the second AlN layer 13 is, for example, 250 seconds or less, more preferably 200 seconds or less, and most preferably 150 seconds or less, and is preferably smaller than the half width of the X-ray rocking curve of AlN (0002) of the first AlN layer 12. In this step, the second AlN layer 13 is formed so that the half width of the X-ray rocking curve of AlN (10-12) of the second AlN layer 13 is, for example, 500 seconds or less, more preferably 400 seconds or less, and most preferably 300 seconds or less, and is preferably smaller than the half width of the X-ray rocking curve of AlN (10-12) of the first AlN layer 12. Thereby, the crystallinity of the nitride semiconductor layer grown on the second AlN layer 13 can be improved.

Thereby, the nitride semiconductor laminate structure 10 of this embodiment is obtained. According to the production method of this embodiment, an absolute value of a strain amount $\varepsilon_2$ of the second AlN layer 13 in the a-axis direction is smaller than an absolute value of a strain amount $\varepsilon_1$ of the first MN layer 12 in the a-axis direction. Thereby, the strain accumulated in a nitride semiconductor layer can be reduced, for example, when the nitride semiconductor layer is laminated on the second AlN layer 13 in order to attain an ultraviolet LED. As a result, the characteristics of the ultraviolet LED can be improved.

(3) Effect According to this Embodiment

According to this embodiment, one or more effects described below are achieved.

(a) In the nitride semiconductor laminate structure 10 of this embodiment, an absolute value of a strain amount $\varepsilon_2$ of the second AlN layer 13 in the a-axis direction is smaller than an absolute value of a strain amount $\varepsilon_1$ of the first AlN layer 12 in the a-axis direction. Thereby, the strain accumulated in an AlGaN layer can be reduced, for example, when the AlGaN having a lattice constant larger than that of AlN is laminated on the surface 16 of the second AlN layer 13 in order to attain an ultraviolet LED.

A large compressive strain is often placed on a growth surface of the conventional AlN template in the direction parallel to the surface. Therefore, for example, when AlGaN is laminated on the AlN template, the gap between a-axis lengths of the AlN layer and the AlGaN layer becomes larger, and thus a larger strain is accumulated in the AlGaN layer. Such a large accumulation of strain produces, for example, deterioration in the surface condition of the AlGaN layer and rapid lattice relaxation in the light-emitting layer portion, in the ultraviolet LED, which causes characteristic deterioration.

In this embodiment, since the second AlN layer 13 is formed after the surface 15 of the first AlN layer 12 is modified by the heat-treatment, the strain in the second AlN layer 13 can be reduced. Namely, an AlN template with low strain and suitable for producing an ultraviolet LED can be attained. As a result, the characteristics (e.g., light-emission output, light-emission lifetime) of the ultraviolet LED can be improved.

(b) In this embodiment, the strain amount $\varepsilon_1$ of the first AlN layer 12 in the a-axis direction is, for example, −0.6% or more and −0.2% or less, and the strain amount $\varepsilon_2$ of the second AlN layer 13 in the a-axis direction is, for example, −0.15% or more and 0.1% or less. In this embodiment, since the second AlN layer 13 is formed after the surface 15 of the first AlN layer 12 is modified by the heat-treatment, the second AlN layer 13 that is almost strain-free can be formed.

(c) In this embodiment, the crystallinity of the second AlN layer 13 is equal to or higher than that of the first AlN layer 12. Since the heat-treatment is performed on the surface 15 of the first AlN layer 12 under appropriate conditions, the surface 15 is modified, and an appropriate amount of point defects is introduced while good surface conditions are maintained. Accordingly, a higher-quality second AlN layer 13 can be formed. As a result, the crystallinity of the nitride semiconductor layer grown on the second AlN layer 13 can be improved.

(d) In this embodiment, the half width of the X-ray rocking curve of AlN (0002) of the first AlN layer 12 is, for example, 250 seconds or less (more preferably, 200 seconds or less, and most preferably 150 seconds or less). In addition, the half width of the X-ray rocking curve of AlN (0002) of the second AlN layer 13 is, for example, 250 seconds or less (more preferably 200 seconds or less, and most preferably 150 seconds or less), and is preferably smaller than the half width of the X-ray rocking curve of AlN (0002) of the first AlN layer 12. Thereby, the crystallinity of the nitride semiconductor layer grown on the second AlN layer 13 can be improved. As a result, the light-emission output of the ultraviolet LED can be improved.

(e) In this embodiment, the half width of the X-ray rocking curve of AlN (10-12) of the first AlN layer 12 is, for example, 500 seconds or less (more preferably, 400 seconds or less, and most preferably 300 seconds or less). In addition, the half width of the X-ray rocking curve of AlN (10-12) of the second AlN layer 13 is, for example, 500 seconds or less (more preferably 400 seconds or less, and most preferably 300 seconds or less), and is preferably smaller than the half width of the X-ray rocking curve of AlN (10-12) of the first AlN layer 12. Thereby, the crystallinity of the nitride semiconductor layer grown on the second AlN layer 13 can be improved. As a result, the light-emission output of the ultraviolet LED can be improved.

(f) The heat-treatment step S103 is performed in an atmosphere containing hydrogen gas. Since the heat-treatment is performed in an atmosphere containing hydrogen gas, a large number of nitrogen vacancies are formed in the AlN, the nitrogen vacancies acting as voids of atomic size. Thereby, the strain in the second AlN layer 13 on which the first AlN layer 12 is grown is relaxed.

(g) The heat-treatment step S103 of this embodiment begins in an atmosphere containing substantially no ammonia. Specifically, the step is performed without supplying NH$_3$ gas, for example. Thereby, the strain in the second AlN layer 13 grown on the first AlN layer 12 can be relaxed without suppressing the formation of point defects (nitrogen vacancies).

(h) The heat-treatment temperature in the heat-treatment step S103 of this embodiment is preferably 900° C. or more and 1,300° C. or less, for example. The heat-treatment time is, for example, preferably 10 minutes or more and 120 minutes or less, more preferably 30 minutes or more and 90 minutes or less, and most preferably 60 minutes. Thereby, the surface 15 can be efficiently modified. When the heat-treatment time is appropriately controlled, an appropriate amount of point defects is introduced while the surface condition of the surface 15 is kept flat. Therefore, the crystallinity of the second AlN layer 13 formed on the surface 15 can be improved compared to that of the first AlN layer 12.

(4) Application Example of First Embodiment

Figure 3:
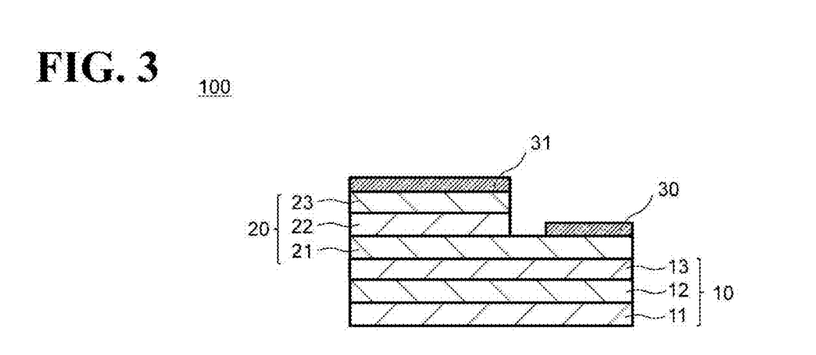
FIG. 3 is a schematic cross-sectional view of a nitride semiconductor light-emitting element 100 according to an application example of the first embodiment of the present disclosure.

Next, as an application example of the first embodiment, nitride semiconductor light-emitting element 100 as an ultraviolet LED having the nitride semiconductor laminate structure 10 will be illustrated.

FIG. 3 is a schematic cross-sectional view of a nitride semiconductor light-emitting element 100 of this application example. As illustrated in FIG. 3, the nitride semiconductor light-emitting element 100 of this application example includes, for example, nitride semiconductor laminate structure 10, light-emitting structure 20, n-side electrode 30, and p-side electrode 31. Since the nitride semiconductor laminate structure 10 is similar to that of the first embodiment, the description thereof will be omitted.

The light-emitting structure 20 is formed, for example, on the second AlN layer 13 and is constituted by laminating the nitride semiconductor layer. The light-emitting structure 20 includes, for example, n-type semiconductor layer 21, light-emitting layer 22, and p-type semiconductor layer 23.

The n-type semiconductor layer 21 is formed, for example, on the second AlN layer 13 and is constituted by n-type AlGaN. The light-emitting layer 22 is formed, for example, on the n-type semiconductor layer 21 and is constituted by a multiple quantum well layer in which AlGaN layers having different Al compositions are alternately laminated. The p-type semiconductor layer 23 is formed, for example, on the light-emitting layer 22 and is constituted by laminating an electron blocking layer constituted by a p-type AlGaN of high-Al composition, a p-type AlGaN layer, and a p-type GaN contact layer. Each layer constituting the light-emitting structure 20 is formed by, for example, a MOCVD method (Metal Organic Chemical Vapor Deposition).

The light-emitting structure 20 may have a strain relaxation layer (not shown) between the second AlN layer 13 and the n-type semiconductor layer 21, as needed. Examples of the strain relaxation layer include a composition gradient layer and a superlattice layer.

The n-side electrode 30 is formed on, for example, the n-type semiconductor layer 21. A Ti/Al electrode or the like is used as a n-side electrode 30. The p-side electrode 31 is formed on, for example, the p-type semiconductor layer 23. A Ni/Au electrode, a Ni/Al electrode, Rh electrode or the like is used as a p-side electrode 31.

Also, in this application example, an absolute value of a strain amount $\varepsilon_2$ of the second AlN layer 13 in the a-axis direction is smaller than an absolute value of a strain amount $\varepsilon_1$ of the first AlN layer 12 in the a-axis direction. Therefore, the gap between the a-axis lengths of the second AlN layer 13 and the n-type semiconductor layer 21 (e.g., n-type AlGaN) constituting the light-emitting structure 20 becomes smaller, and the strain accumulated in the n-type semiconductor layer 21 can be reduced. Further, the strain accumulated in the light-emitting layer 22 formed on the n-type semiconductor layer 21 and the p-type semiconductor layer 23 formed on the light-emitting layer 22 can also be reduced. Thereby, the characteristics of the nitride semiconductor light-emitting element 100 as an ultraviolet LED can be improved.

Other Embodiments of the Disclosure

Although the embodiments of the present disclosure have been specifically described above, the present disclosure is not limited to the above-described embodiments, and various modifications can be made without departing from the gist thereof.

For example, in the above-described embodiment, the first AlN layer 12 is formed on the principal surface 14 of the sapphire substrate 11. However, an AlN template in which an AlN layer is formed on the sapphire substrate in advance may be prepared. This embodiment does not require to perform the first AlN layer formation step S102 and, therefore, can be more easily performed.

Figure 7:
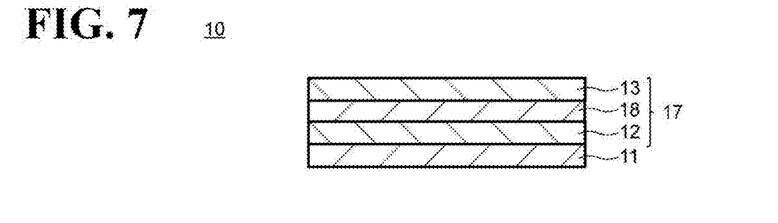
FIG. 7 is a schematic cross-sectional view of a nitride semiconductor laminate structure 10 according to another embodiment of the present disclosure.

The above embodiment describes the case where the AlN layer 17 has a two-layered structure including the first AlN layer 12 and the second AlN layer 13. However, the AlN layer 17 may have a structure including three or more layers. For example, the growth of the AlN layer and the heat-treatment similar to that in the heat-treatment step S103 can be repeated between the heat-treatment step S103 and the second AlN layer formation step S104 to obtain the nitride semiconductor laminate structure 10 as illustrated in FIG. 7. As illustrated in FIG. 7, the nitride semiconductor laminate structure 10 may have the first AlN layer 12 formed on the sapphire substrate 11, the intermediate AlN layer 18 formed on the first AlN layer 12 (i.e., between the first AlN layer 12 and the second AlN layer 13), and the second AlN layer 13 formed above the first AlN layer 12 through the intermediate AlN layer 18. That is, at least the second AlN layer 13 is formed on the first AlN layer 12. Even in such a case, it is possible to obtain the strain amount in the a-axis direction which is sufficiently low (for example, −0.15% or more and 0.1% or less) on the outermost surface of the whole AlN layer 17 which is finally obtained. In this case, the strain amount of the AlN layer 17 in the a-axis direction changes, not in two stages, but in three, four, or five stages, or in some cases, continuously. Consequently, an AlN template is obtained, in which the strain of the surface of the finally obtained AlN layer 17 is, for example, −0.15% or more and 0.1% or less. Specifically, for example, an AlN template is obtained, in which the absolute value of the strain amount $\varepsilon_3$ of the intermediate AlN layer 18 in the a-axis direction is between the absolute value of the strain amount $\varepsilon_1$ of the first AlN layer 12 in the a-axis direction and the absolute value of the strain amount $\varepsilon_2$ of the second AlN layer 13 in the a-axis direction, and the strain amount $\varepsilon_2$ is −0.15% or more and 0.1% or less.

The above embodiment describes the case where each layer constituting the light-emitting structure 20 is constituted by an AlGaN layer or a GaN layer. However, each layer may be constituted by an InAlGaN layer that contains several percent of In. In this case, the light-emission efficiency of the ultraviolet LED can be improved.

Examples

Next, examples according to the present disclosure will be described. These examples are illustrative examples of the present disclosure, and the present disclosure is not limited by these examples.

(1) Sample Preparation

Samples 1 to 5 were prepared as follows.

Sapphire substrate 11 having principal surface 14 with an off-angle of 0.2° was prepared, and first AlN layer 12 was formed on the principal surface 14 by the HVPE method to a thickness of 0.45 µm.

As for sample 1, heat-treatment was not performed, and the second AlN layer 13 was formed in a thickness of 0.30 µm on the first AlN layer 12 by the HVPE method.

As for sample 2, the surface 15 of the first AlN layer 12 was heat-treated in $H_2$ gas atmosphere at 1,000° C. for 10 minutes, and thereafter the second AlN layer 13 was formed in a thickness of 0.30 µm on the first AlN layer 12 by the HVPE method.

As for sample 3, the surface 15 of the first AlN layer 12 was heat-treated in $H_2$ gas atmosphere at 1,000° C. for 20 minutes, and thereafter the second AlN layer 13 was formed in a thickness of 0.30 µm on the first AlN layer 12 by the HVPE method.

As for sample 4, the surface 15 of the first AlN layer 12 was heat-treated in $H_2$ gas atmosphere at 1,000° C. for 30 minutes, and thereafter the second AlN layer 13 was formed in a thickness of 0.30 µm on the first AlN layer 12 by the HVPE method.

As for sample 5, the surface 15 of the first AlN layer 12 was heat-treated in $H_2$ gas atmosphere at 1,000° C. for 60 minutes, and thereafter the second AlN layer 13 was formed in a thickness of 0.70 µm on the first AlN layer 12 by the HVPE method.

(2) X-Ray Diffraction Measurement of AlN Layer

The results of X-ray diffraction measurement of samples prepared in (1) are illustrated below.

Figure 4A:
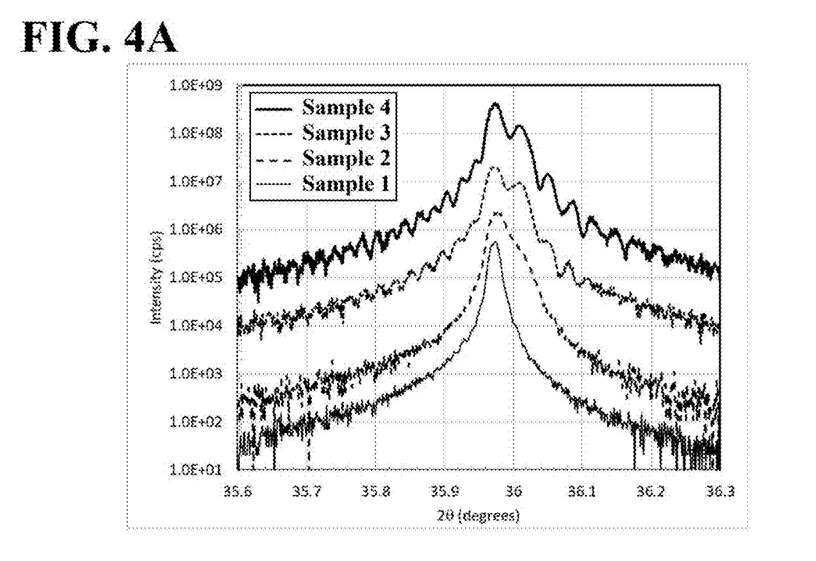
FIG. 4A is a graph illustrating the results of 2θ-ω scan X-ray diffraction measurement of an AlN layer according to an example of the present disclosure.
Figure 4B:
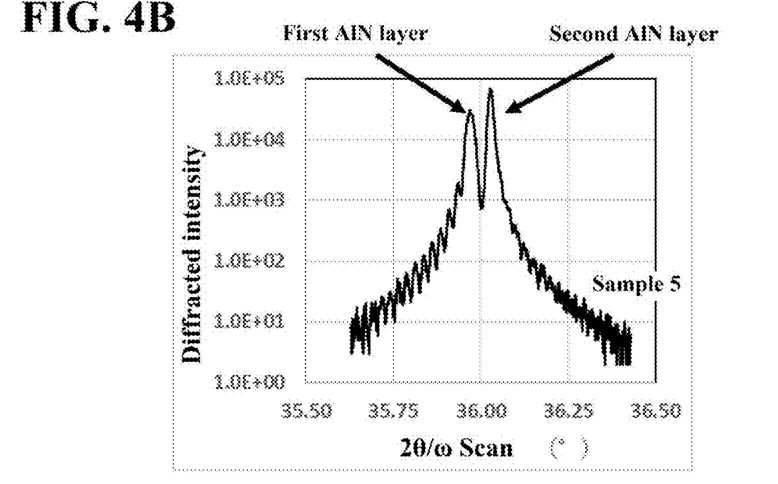
FIG. 4B is a graph illustrating the results of 2θ-ω scan X-ray diffraction measurement of an AlN layer according to an example of the present disclosure.

In order to illustrate the change in the c-axis lengths between the first AlN layer 12 and the second AlN layer 13, 2θ-ω scan X-ray diffraction measurement of AlN (0002) was performed on samples 1 to 5. FIG. 4A illustrates the results of samples 1 to 4, and FIG. 4B illustrates the results of sample 5. In FIG. 4A and FIG. 4B, the c-axis becomes shorter as the peak position shifts to the right, that is, as 2θ becomes higher. In sample 1 which has not been heat-treated, the peak of the first AlN layer 12 overlapped with the peak of the second AlN layer 13, and no change in the c-axis length was observed. On the other hand, in samples 2 to 5 which had been heat-treated, a peak representing the second AlN layer 13 was confirmed to the right of the peak of sample 1. Particularly, in sample 5, the peaks of the first AlN layer 12 and the second AlN layer 13 were clearly separated. That is, the second AlN layer 13 of the heat-treated samples 2 to 5 was found to have a shorter c-axis than that of the first AlN layer 12. In other words, the second AlN layer 13 of samples 2 to 4 were found to have a relaxed compressive strain in a direction parallel to its surface 16 (for example, in the a-axis direction).

In order to illustrate the change in crystallinity between the first AlN layer 12 and the second AlN layer 13, X-ray rocking curve measurement was performed on samples 1 to 5. Table 1 illustrates the results. In sample 1 which had not been heat-treated, the peak of the first AlN layer 12 overlapped with the peak of the second AlN layer 13. The half width when the peak of the first AlN layer 12 overlapped with the second AlN layer 13 was 81 seconds for AlN (0002) and 297 seconds for AlN (10-12). On the other hand, the half width of X-ray rocking curve of the second AlN layer 13 of sample 2 which had been heat-treated was 98 seconds for AlN (0002) and 298 seconds for AlN (10-12). The half width of sample 3 was 81 seconds for AlN (0002) and 297 seconds for AlN (10-12), and the half width of sample 4 was 75 seconds for AlN (0002) and 285 seconds for AlN (10-12). The half width of sample 5 which had thicker second AlN layer 13 and was heat-treated for longer heat-treatment time compared to samples 1 to 4 was 35 seconds for AlN (0002) and 270 seconds for AlN (10-12). In view of the foregoing, it is confirmed that the second AlN layer 13 having crystallinity equal to or higher than that of the first AlN layer 12 can be formed even when the heat-treatment is performed. In particular, it is confirmed that the second AlN layer 13 having higher crystallinity than that of the first AlN layer 12 can be formed when the heat-treatment time is 30 minutes or more.

TABLE 1

| | Heat-treatment Time (min) | Half-width of X-ray Rocking Curve (sec) | |
|---|---|---|---|
| | | AlN (0002) | AlN (10-12) |
| Sample 1 | — | 81 | 297 |
| Sample 2 | 10 | 98 | 298 |
| Sample 3 | 20 | 81 | 297 |
| Sample 4 | 30 | 75 | 285 |
| Sample 5 | 60 | 35 | 270 |

Figure 5A:
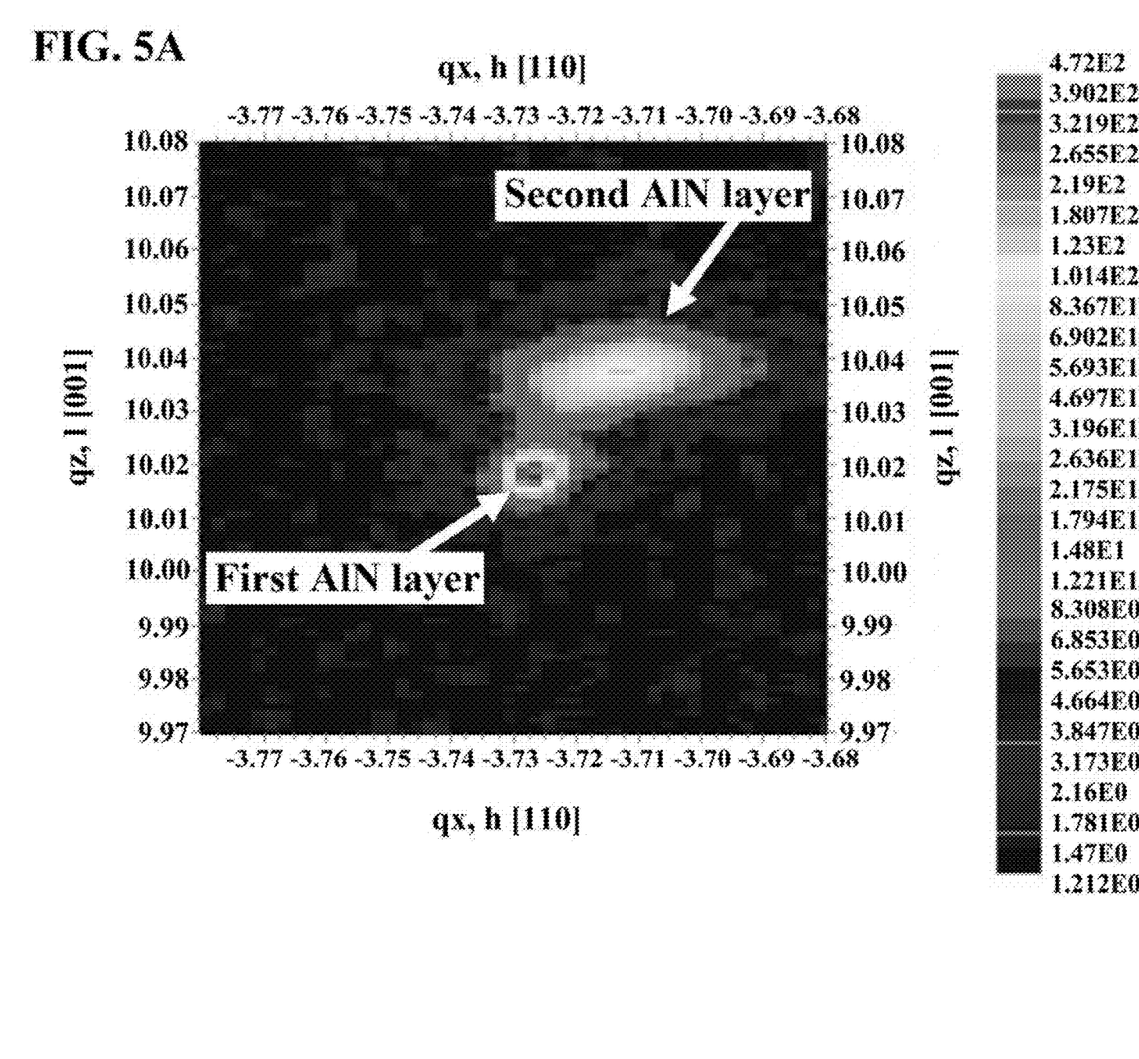
FIG. 5A is a graph illustrating the results of X-ray reciprocal lattice map measurement of an AlN layer according to an example of the present disclosure.
Figure 5B:
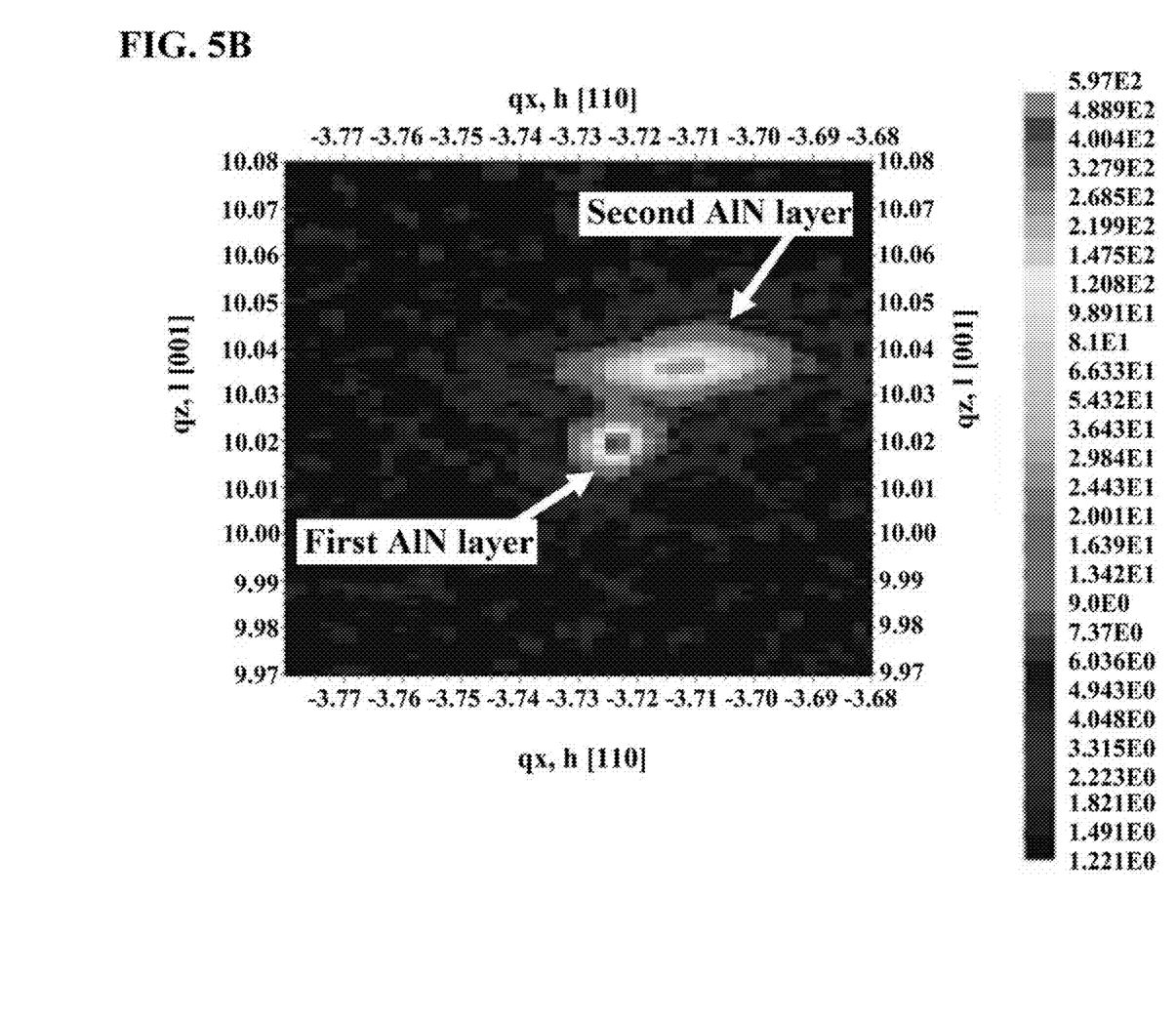
FIG. 5B is a graph illustrating the results of X-ray reciprocal lattice map measurement of an AlN layer according to an example of the present disclosure.

X-ray reciprocal lattice map measurements were performed on sample 1 prior to the formation of the second AlN layer 13, and on samples 1 to 5, in order to illustrate the specific values of the a-axis length and c-axis length of the first AlN layer 12 and the second AlN layer 13. FIG. 5A illustrates the results of sample 4, and FIG. 5B illustrates the results of sample 5. In both samples 4 and 5, which have been heat-treated, it is confirmed that the peaks of the first AlN layer 12 and the second AlN layer 13 were clearly separated from each other, and that the a-axis length and the c-axis length are changed.

Figure 6:
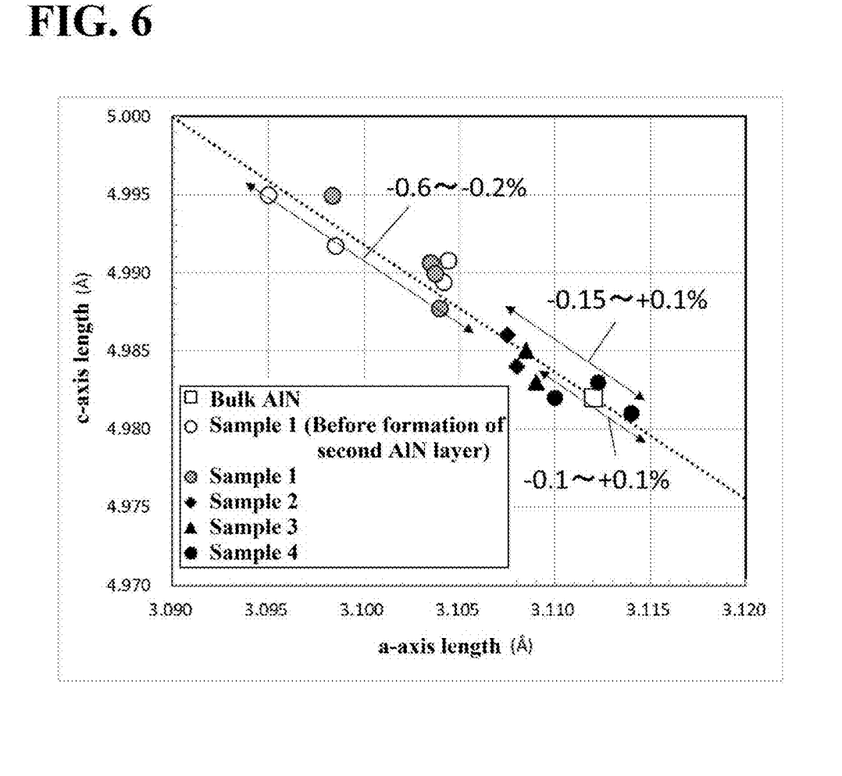
FIG. 6 is a graph illustrating the values of an a-axis length and a c-axis length of an AlN layer according to an example of the present disclosure.

In addition, the a-axis length and the c-axis length of each AlN layer were obtained from the results of the X-ray reciprocal lattice map measurement. Table 6 illustrates the results. In several samples prepared under the same conditions as those for sample 1 before forming the second AlN layer 13, that is, the first AlN layer 12, the a-axis length was shorter and the c-axis length was longer, compared to the strain-free, bulk AlN. In sample 1 which had not been heat-treated (including samples prepared under the same conditions as those for this sample, hereinafter referred to as sample 1), the peak of the first AlN layer 12 overlapped with the peak of the second AlN layer 13, and, in the second AlN layer 13 of sample 1, the a-axis length was shorter and the c-axis length was longer, compared to the strain-free, bulk AlN. That is, the first AlN layer 12 and the second AlN layer 13 of sample 1 experienced compressive strain in the a-axis direction, and the strain amount in the a-axis direction was −0.6% or more and −0.2% or less. On the other hand, the a-axis length and the c-axis length of the second the AlN layer 13 of samples 2 to 4 which had been heat-treated (including samples prepared under the same conditions as those for these samples; hereinafter referred to as samples 2 to 4, respectively) were close to those of the strain-free, bulk AlN, and the strain amount of the second AlN layer 13 of samples 2 to 4 in the a-axis direction was −0.15% or more and 0.1% or less. In particular, the second AlN layer 13 of sample 4, which had been heat-treated for 30 minutes, was almost strain-free, and the strain amount in the a-axis direction was −0.1% or more and 0.1% or less. In view of the foregoing, it is confirmed that the strain in the second AlN layer 13 can be relaxed when the heat-treatment is performed for 10 minutes or more. It is also confirmed that the second AlN layer 13, which is almost strain-free, can be formed by performing heat-treatment for 30 minutes or more.

The inspection on the polarities of the surface 15 of the first AlN layer 12 used in this example and the surface 16 of the second AlN layer 13 grown under the same conditions as those for samples 1 to 5 by KOH etching confirmed that all the surfaces were not modified by KOH etching and had Al polarity.

Preferable Aspects of the Disclosure

Hereinafter, supplementary descriptions of the preferred aspects of the present disclosure will be given.

(Supplementary Description 1)

In an aspect of the present disclosure, there is provided a nitride semiconductor laminate structure, including at least:

a sapphire substrate, a first AlN layer formed on a principal surface of the sapphire substrate, and a second AlN layer formed on the first AlN layer, wherein an absolute value of a strain amount $\varepsilon_2$ of the second AlN layer in the a-axis direction is smaller than an absolute value of a strain amount $\varepsilon_1$ of the first AlN layer in the a-axis direction.

(Supplementary Description 2)

The nitride semiconductor laminate structure according to supplementary description 1, wherein the sapphire substrate has the principal surface in which the c-plane is inclined by an off-angle of 1.5° or less.

Preferably, the off-angle is 0.05° or more and 1° or less.

(Supplementary Description 3)

The nitride semiconductor laminate structure according to supplementary description 1 or 2, wherein the strain amount $\varepsilon_1$ is −0.6% or more and −0.2% or less, and the strain amount $\varepsilon_2$ is −0.15% or more and 0.1% or less.

Preferably, the strain amount $\varepsilon_2$ is −0.1% or more and 0.1% or less.

(Supplementary Description 4)

The nitride semiconductor laminate structure according to any one of supplementary descriptions 1 to 3, wherein a half width of the X-ray rocking curve of AlN (0002) of the second AlN layer is 250 seconds or less.

The half width is more preferably 200 seconds or less, and most preferably 150 seconds or less.

(Supplementary Description 5)

The nitride semiconductor laminate structure according to any one of supplementary descriptions 1 to 4, wherein the half width of the X-ray rocking curve of AlN (10-12) of the second AlN layer is 500 seconds or less.

The half width is more preferably 400 seconds or less, and most preferably 300 seconds or less.

(Supplementary Description 6)

The nitride semiconductor laminate structure according to any one of supplementary descriptions 1 to 5, wherein the half width of the X-ray rocking curve of AlN (0002) of the second AlN layer is smaller than the half width of the X-ray rocking curve of AlN (0002) of the first AlN layer.

(Supplementary Description 7)

The nitride semiconductor laminate structure according to any one of supplementary descriptions 1 to 6, wherein the half width of the X-ray rocking curve of AlN (10-12) of the second AlN layer is smaller than the half width of the X-ray rocking curve of AlN (10-12) of the first AlN layer.

(Supplementary Description 8)

The nitride semiconductor laminate structure according to any one of supplementary descriptions 1 to 7, further including an intermediate AlN layer formed between the first AlN layer and the second AlN layer, wherein an absolute value of a strain amount $\varepsilon_3$ of the intermediate AlN layer in the a-axis direction is between the absolute value of the strain amount $\varepsilon_1$ and the absolute value of the strain amount $\varepsilon_2$.

(Supplementary Description 9)

In another aspect of the present disclosure, there is provided a nitride semiconductor laminate structure, including:

a sapphire substrate, and an AlN layer formed on a principal surface of the sapphire substrate, wherein a strain amount of AlN constituting a surface of the AlN layer in the a-axis direction is −0.15% or more and 0.1% or less.

Preferably, the strain amount of the AlN in the a-axis direction is −0.1% or more and 0.1% or less.

(Supplementary Description 10)

The nitride semiconductor laminate structure according to supplementary description 9, wherein the sapphire substrate has the principal surface in which the c-plane is inclined by an off-angle of 1.5° or less.

Preferably, the off-angle is 0.05° or more and 1° or less.

(Supplementary Description 11)

The nitride semiconductor laminate structure according to supplementary description 9 or 10, wherein the half width of the X-ray rocking curve of AlN (0002) of the AlN constituting the surface of the AlN layer is 250 seconds or less.

The half width is more preferably 200 seconds or less, and most preferably 150 seconds or less.

(Supplementary Description 12)

The nitride semiconductor laminate structure according to any one of supplementary descriptions 9 to 11, wherein the half width of the X-ray rocking curve of AlN (10-12) of AlN constituting the surface of the AlN layer is 500 seconds or less.

The half width is more preferably 400 seconds or less, and most preferably 300 seconds or less.

(Supplementary Description 13)

A nitride semiconductor light-emitting element, in which a light-emitting structure constituted by laminating nitride semiconductor layers is formed on the nitride semiconductor laminate structure according to any one of supplementary descriptions 1 to 12.

(Supplementary Description 14)

In another aspect of the present disclosure, there is provided a method for producing a nitride semiconductor laminate structure, including:

a step of preparing a sapphire substrate, a step of forming a first AlN layer on a principal surface of the sapphire substrate, a step of performing heat-treatment on the surface of the first AlN layer in an atmosphere containing hydrogen gas and substantially no ammonia, and a step of forming a second AlN layer on the first AlN layer, wherein an absolute value of a strain amount $\varepsilon_2$ of the second AlN layer in the a-axis direction is smaller than an absolute value of a strain amount $\varepsilon_1$ of the first AlN layer in the a-axis direction.

(Supplementary Description 15)

In another aspect of the present disclosure, there is provided a method for producing a nitride semiconductor laminate structure, including:

a step of preparing a sapphire substrate, a step of forming an AlN layer on a principal surface of the sapphire substrate, a step of performing heat-treatment on a surface of the AlN layer in an atmosphere containing hydrogen gas and substantially no ammonia, and a step of re-growing AlN on the AlN layer, wherein, after the step of re-growing the AlN, a strain amount of AlN constituting the surface of the AlN layer in the a-axis direction is −0.15% or more and 0.1% or less.

Preferably, the strain amount of the AlN in the a-axis direction is −0.1% or more and 0.1% or less.

(Supplementary Description 16)

The method for producing the nitride semiconductor laminate structure according to supplementary description 14 or 15, wherein the heat-treatment is performed at 900° C. or more for 10 minutes or more in the step of performing heat-treatment.

In the step of performing heat-treatment, the heat-treatment is preferably performed at 900° C. or more and 1,300° C. or less for 10 minutes or more and 120 minutes or less.

In the step of performing heat-treatment, the heat-treatment is more preferably performed at 900° C. or more and 1,300° C. or less for 30 minutes or more and 90 minutes or less.

EXPLANATION OF NUMERALS

10 Nitride Semiconductor Laminate Structure
11 Sapphire Substrate
12 First AlN Layer
13 Second AlN Layer
14 Principal Surface
15 Surface
16 Surface
17 AlN Layer
18 Intermediate AlN Layer
20 Light-Emitting Structure
21 n-type Semiconductor Layer
22 Light-Emitting Layer
23 p-type Semiconductor Layer
30 n-side Electrode
31 p-side Electrode
100 Nitride Semiconductor Light-Emitting Element
S101 Substrate Preparation Step
S102 First AlN Layer Formation Step
S103 Heat-treatment Step
S104 Second AlN Layer Formation Step

What is claimed is:

1. A nitride semiconductor laminate structure, comprising at least:

a sapphire substrate, a first AlN layer formed on a principal surface of the sapphire substrate, and a second AlN layer formed on the first AlN layer, wherein an absolute value of a strain amount $\varepsilon_2$ of the second AlN layer in the a-axis direction is smaller than an absolute value of a strain amount $\varepsilon_1$ of the first AlN layer in the a-axis direction, wherein the sapphire substrate has the principal surface in which the c-plane is inclined, and wherein the strain amount $\varepsilon_1$ is −0.6% or more and −0.2% or less, and the strain amount $\varepsilon_2$ is −0.15% or more and 0.1% or less.

2. The nitride semiconductor laminate structure according to claim 1, wherein the sapphire substrate has the principal surface in which the c-plane is inclined by an off-angle of 1.5° or less.

3. The nitride semiconductor laminate structure according to claim 1, wherein a half width of the X-ray rocking curve of AlN (0002) of the second AlN layer is 250 seconds or less.

4. The nitride semiconductor laminate structure according to claim 1, wherein a half width of the X-ray rocking curve of AlN (10-12) of the second AlN layer is 500 seconds or less.

5. The nitride semiconductor laminate structure according to claim 1, wherein the half width of the X-ray rocking curve of AlN (0002) of the second AlN layer is smaller than the half width of the X-ray rocking curve of AlN (0002) of the first AlN layer.

6. The nitride semiconductor laminate structure according to claim 1, wherein the half width of the X-ray rocking curve of AlN (10-12) of the second AlN layer is smaller than the half width of the X-ray rocking curve of AlN (10-12) of the first AlN layer.

7. A nitride semiconductor light-emitting element, in which a light-emitting structure constituted by laminating nitride semiconductor layers is formed on the nitride semiconductor laminate structure according to claim 1.

* * * * *